United States Patent [19]
Hutchison

[11] 3,984,166
[45] Oct. 5, 1976

[54] SEMICONDUCTOR DEVICE PACKAGE HAVING LEAD FRAME STRUCTURE WITH INTEGRAL SPRING CONTACTS

[75] Inventor: Robert V. Hutchison, Oceanside, Calif.

[73] Assignee: Burroughs Corporation, Detroit, Mich.

[22] Filed: May 7, 1975

[21] Appl. No.: 575,180

[52] U.S. Cl. .................... 339/17 CF; 174/16 HS; 174/52 FP
[51] Int. Cl.² ...................... H05K 1/12; H05K 5/06
[58] Field of Search ............ 339/17 R, 17 C, 17 CF; 174/16 HS, 52 FP

[56] References Cited
UNITED STATES PATENTS

| | | | |
|---|---|---|---|
| 3,311,790 | 3/1967 | Vizzier et al. | 339/17 CF |
| 3,340,347 | 9/1967 | Spiegler | 174/52 FP |
| 3,634,600 | 1/1972 | Griffin et al. | 174/52 FP |
| 3,678,385 | 7/1972 | Bruner | 339/17 CF |
| 3,735,214 | 5/1973 | Renskers et al. | 174/52 FP |
| 3,930,115 | 12/1975 | Uden et al. | 339/17 CF X |

FOREIGN PATENTS OR APPLICATIONS 2,056,193   8/1971   Germany ...................... 339/17 CF

OTHER PUBLICATIONS

Arnold et al.; Integrated Circuit Component; IBM Tech. Disclosure Bulletin vol. 12, No. 6, Nov. 1969; p. 793.

Primary Examiner—Roy Lake
Assistant Examiner—Craig R. Feinberg
Attorney, Agent, or Firm—G. Gregory Schivley; Mervyn L. Young; Kevin R. Peterson

[57] ABSTRACT

A semiconductor device package which can be readily mounted on a printed circuit board without requiring soldering or intermediate connectors. A supporting substrate has a unique lead frame configuration thereon in which the leads extend around side portions of the substrate and form integral spring contacts projecting from the lower surface of the substrate. The package preferably includes a metallic stud having a head portion mounted in the substrate for receiving a semiconductor device and a rod portion extending from the lower surface of the substrate. The rod portion of the stud can be removably secured in an aperture in a printed circuit board to engage the spring contacts with corresponding conductors on the circuit board.

12 Claims, 4 Drawing Figures

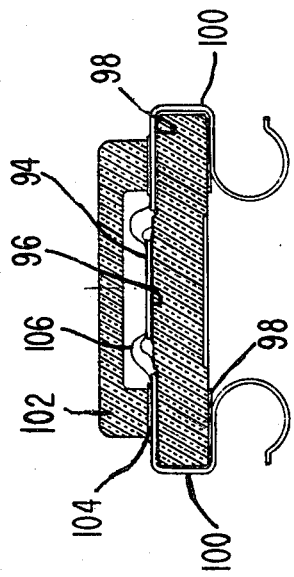
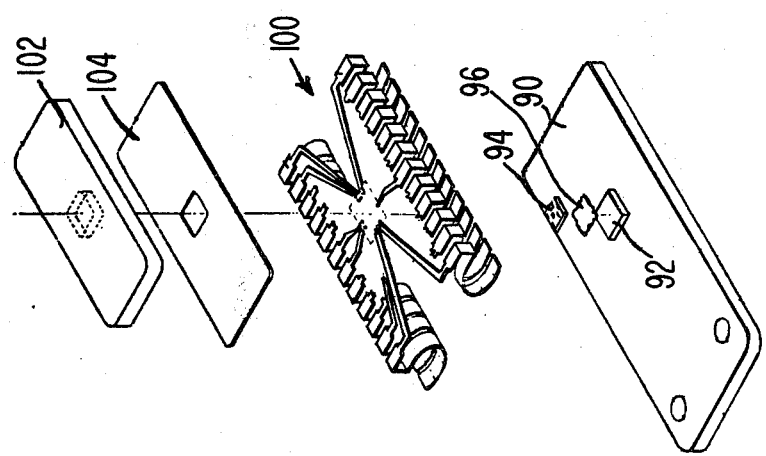

SEMICONDUCTOR DEVICE PACKAGE HAVING LEAD FRAME STRUCTURE WITH INTEGRAL SPRING CONTACTS

BACKGROUND OF THE INVENTION

This invention relates to semiconductor devices. More particularly, it relates to a package for a semiconductor device which is easily mountable on a printed circuit board.

Various schemes have been employed to package semiconductor devices. One of the most widely accepted schemes is the dual in-line package (DIP). Briefly, the DIP has a plurality of leads extending from both sides of an elongated rectangular body. The leads are bent so that they project downwardly to form a plurality of linear connector pins bounding the body of the package parallel to its side portions. The leads are generally soldered into corresponding holes in a printed circuit board in order to make external electrical connection to other devices. While the DIP has proved satisfactory in many applications, it has its drawbacks when it is realized that the package may have to be removed from the printed circuit board for various reasons. In order to remove the DIP from the printed circuit board, one must unsolder all of the leads. This of course is a time consuming operation which also requires access to a heat source such as a soldering iron. Furthermore, this can result in permanent damage to the printed circuit board.

In those applications where the package may foreseeably need to be removed from the printed circuit board, other packaging schemes have been suggested. For example, the semiconductor device has been mounted in a leadless-type package. Unlike the DIP, the leadless package does not have discrete leads extending from its main body portion. Accordingly, an intermediate connector is required to interface it with the printed circuit board. One of such connectors, as well as a leadless-type package, is disclosed in U.S. Pat. No. 3,771,109 Bruckner et al. Therefore, while the leadless package permits one to remove it from the printed circuit board, for example in order to replace a faulty semiconductor device, it necessarily requires an intermediate connector in order to make external electrical connection to other devices on the board. Unfortunately, these intermediate connectors tend to be expensive and may not provide reliable electrical connection to the conductors on the printed circuit board. This reduced reliability is due to the fact that multiple interfaces are used to provide the electrically conductive path between the device and the printed circuit board. Each pad on the leadless package is interfaced with a contact element in the connector, with the contact element, in turn, interfaced with the conductors on the circuit board. Each interface is a potential source of an unreliable connection.

OBJECT AND SUMMARY OF THE INVENTION

Therefore, it is the primary object of this invention to provide a semiconductor device package that can be readily mounted on a printed circuit board without requiring soldering or intermediate connectors. It is a further object of this invention to accomplish the primary objective while also providing excellent heat dissipation for the semiconductor device to be packaged. It is a further object of this invention to provide a subassembly for the semiconductor device package which provides a continuous interfaceless electrically conductive path between the device and conductors on the printed circuit board.

These and other objects of this invention are accomplished through the use of a substrate having a unique lead frame configuration. The leads extend not only on the upper surface of the substrate but extend around side portions thereof and form resilient spring contacts which project from the lower surface of the substrate. In such manner the lead frame provides a continuous interfaceless electrically conductive path for connecting a semiconductor device mounted on the substrate to conductors on a printed circuit board. Other features of this invention include a thermally conductive stud which is mounted in an opening in the substrate. The stud includes an end face for receiving a semiconductor device, and a rod-like body portion extending from the lower surface of the substrate. The rod portion of the stud can be removably secured in an aperture in a printed circuit board to engage the spring contacts with corresponding conductors on the circuit board. Preferably, the printed circuit board includes a metallic heat conductive core which provides additional heat dissipation for the semiconductor device. In one embodiment, the rod portion of the stud is slidably inserted into a receptacle in the printed circuit board aperture. A ferrule of thermally deformable metal surrounds the receptacle below the circuit board. The ferrule clamps the receptacle securely around the rod portion of the stud to prevent any movement of the package which may deleteriously affect the electrical connections between the spring contacts and their corresponding circuit board conductors.

BRIEF DESCRIPTION OF THE DRAWING

FIG. 3 shows an exploded perspective view of another semiconductor device package utilizing the lead frame structure of this invention; and FIG. 4 shows a sectional view of the assembled package shown in FIG. 3.

DESCRIPTION OF THE PREFERRED EMBODIMENT

Figure 1:
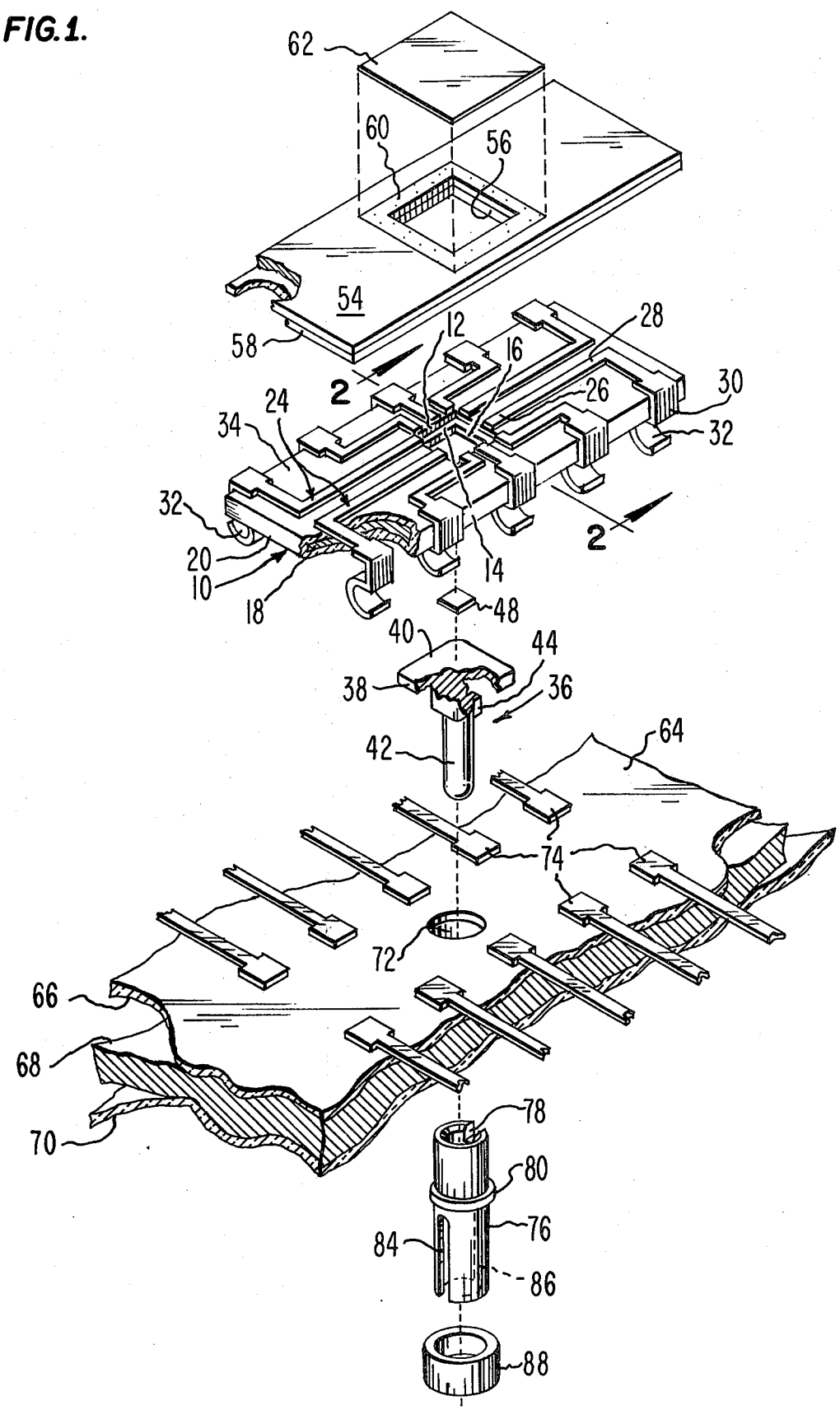
FIG 1 shows an exploded perspective view of a semiconductor device package made in accordance with one embodiment of this invention.

Referring now to the drawings, a substrate 10 includes a centrally located rectangular recess 12. Recess 12 includes a flat bottom surface 14 forming a ledge which is generally parallel with the upper major surface 18 of the substrate 10. Recess 12 also includes a generally rectangular opening 16 extending from surface 14. In this embodiment, recess 12 is approximately 0.25 inch square, whereas opening 16 is approximately 0.15 inch square. Preferably, substrate 10 is made from copper alloy 638. Substrate 10 has two substantially parallel opposite major surfaces, upper surface 18 and lower surface 20. Substrate 10 also includes side portions 22 on its elongated sides thereof.

Special consideration is now given to the unique lead frame configuration on substrate 10. The lead frame is about 0.005 inch thick in this embodiment and includes a plurality of spaced finger members generally designated by the numeral 24. Each finger member 24 includes inner portions 26 which mutually converge on recess 12. Intermediate lead frame portions 28 radially extend from inner portions 26 and diverge outwardly towards side portions 22 of substrate 10. It is an important aspect of this invention that lead frame fingers 24 include outer portions 30 which extend around substrate side portions 22. Outer portions 30 also continue around substrate side portions 22 and extend inwardly on the lower surface 20 toward the middle or central portions thereof. Outer portions 30 then project arcuately from lower surface 20 to form open ended ring-like resilient spring contacts 32. Spring contacts 32 project from lower surface 20 and are biased with respect to lower surface 20. That is, spring contacts 32 can yield in the direction of lower surface 20 upon application of a force in that direction. It should be noted that lead frame fingers 24 thus provide a continuous interfaceless electrically conductive path for connecting a semiconductor device to conductors on a printed circuit board. In such manner, multiple points of interconnection are eliminated thereby increasing the reliability in the electrical connection.

Special consideration should be given to the choice of the lead frame material. The material should be chosen so that it has sufficient resiliency to form the integral spring contacts 32. Preferably, the material chosen for the lead frame should have a yield strength of at least about 80,000 psi. Materials not having this characteristic may be too weak to provide sufficient resiliency for spring contacts 32. The preferred material is copper alloy 638, as designated by the Copper Development Association. Copper alloy 638 is an alloy containing approximately 95 percent copper, 2.8 percent aluminum, 1.8 percent silicon, and 0.4 percent cobalt. Copper alloy 638 is distributed under the trade name CORONZE by Olin Corportion -Brass Division. Alloy 638 is preferred not only because of its excellent mechanical properties, but because of its low cost, high electrical conductivity, and extremely high oxidation and corrosion resistance. Further, alloy 638 forms an extremely important aluminum oxide film on its surface. This film is tighly adherent to the underlying metal surface and is known to wet and bond well to many types of sealing glasses. The importance of this latter property will become clear later in this description.

The discrete lead frame finger members 24 can be temporarily connected together by a frame prior to attachment to the substrate 10 as is often done in the semiconductor packaging art. After stamping and forming, the lead frame then can be attached to the substrate 10 as shown most clearly in FIG. 1. Preferably, the lead frame fingers 24 are attached to the upper surface 18 by a layer 34 of vitreous sealing glass such as 7047 distributed by Corning Glass, Inc. Corning Glass 7047 fuses to and bonds with the tough aluminum oxide film of the alloy 638 substrate and lead frame, and closely matches its comparatively high coefficient of thermal expansion. This combination yields a high-strength and durable hermetic seal. The lead frame can be attached by screening the glass layer 34 onto upper surface 18, the bottom surface 20, and the side portions 22; heating it to its softening point, placing the lead frame on the softened layer, and then cooling it to harden the glass. Preferably, glass layer 34 is approximately 0.005–0.010 inch thick. The glass should remain in this state until the final package subassembly is fired.

A stud 36 serves as a thermally conductive heat sink member. Stud 36 includes a rectangular head 38 with a flat upper surface 40 for receiving a semiconductor device. Stud 36 includes a rod-like body portion 42 depending from the head 38. A rectangular key extension 44 bridges the head 38 and rod portion 42 of stud 36 and provides automatic alignment of the spring contacts 32 with corresponding printed circuit board conductors as will be discussed hereinafter. Stud 36 is preferably of a heat conductive metal. Berylliumcopper alloy 172, ½ hard, has proven to provide extremely satisfactory results. The underside of head 38 is sealed to surface 14 of recess 12 by glass layer 46. Preferably, this is accomplished using a vitreous glass preform.

A semiconductor device 48, such as an integrated circuit chip, is bonded to surface 40 of stud 36. Preferably, this is accomplished by an epoxy adhesive layer 50, such as EPO-TEK H-61, distributed by Epoxy Technology Incorporated of Watertown Massachusetts. Semiconductor device 48 can be bonded directly to surface 40 if electrical isolation is not desired. Furthermore, other methods of attaching the semiconductor device 48 to stud 36 can be used. For example, a beryllium oxide disc can be attached to surface 40 by a gold preform and device 48 attached to the upper surface of the disc by a silicon-gold eutectic bond. Various regions on the semiconductor device 48 are attached to the inner portions 26 of lead frame finger members 24 by filamentary wires 52. This can be accomplished by known ultrasonic or thermocompression bonding. It should also be noted that one or more filamentary wires can be used to connect a portion of semiconductor device 48 to stud 36. The stud 36 can be used, if desired, as an electrically conductive ground contact as will become clear later in this description.

A cover member 54 has generally the same peripheral dimensions as substrate 10. However, cover member 54 has a rectangular opening 56 which is slightly larger than the recess 12 in the substrate 10. Cover member 54 is preferably of copper alloy 638 as is substrate 10 and the lead frame. Cover member 54 is mounted coextensive with the intermediate portions 28 of lead frame finger members 24. Preferably, this is accomplished with a vitreous glass layer 58 which has been previously screened and fired on the bottom surface of cover member 54. The cover member 54 is placed on the upper surface of substrate 10 with glass layer 58 touching the intermediate lead frame portions 28. It should be noted that opening 56 prevents any covering of the inner portions 26 which would hamper the filamentary wire bonding to device 48. The subassembly is then heated to reflow glass layers 34 and 58 to permanently secure the lead frame. Glass layer 46 which seals stud head 38 is also reflowed at the same time.

By providing a rigid cover coextensive with the intermediate lead frame portions 28, the majority of the lead frame is thus sandwiched between two rigid surfaces thereby providing a maximum strength package construction. A lid 62, such as alloy 638, is sealed to the cover 54 using a solder ring 60 to provide a finished hermetically sealed package.

It should be understood that the substrate 10 with the unique lead frame configuration as embodied in this invention provides a subassembly which can be packaged in a variety of manners. Consequently, it can be sold as a separate unit. Similarly, the substrate 10, stud 36, lead frame and cover member 54 form a subassembly which can be shipped to a semiconductor device manufacturer to complete the package. Such manufacturer would mount the semiconductor device 48 to the stud 36 and bond the various regions of the device to the exposed inner portions 26 of the lead frame. Then the lid 62 can be sealed to the cover member 54 to form the completed package.

Attention is now turned a distinctive design for mounting the package onto a printed circuit board 64. The printed circuit board 64 is of a unique construction which provides excellent heat dissipation for the semiconductor device 48 and further provides internal means for making electrical connection to a specified region of the device 48. Circuit board 64 is of a multilayered construction having an upper layer 66, a middle layer 68 and a lower layer 70. Upper layer 66 and lower layer 70 are made of fully cured or A-stage copper clad epoxy glass. Upper layer 66 and lower layer 70 are bonded to middle layer 68 with an adhesive (not shown), such as semi-cured or B-stage epoxy glass. Middle layer 68 is a thermally and electrically conductive metal, such as aluminum or copper. In this example, upper layer 66 is approximately 0.010 inches thick, middle layer 68 is approximately 0.042 inches thick, and lower layer 70 is approximately 0.010 inches thick. Circuit board 64 has a centrally located apertures 72 therein. A plurality of printed circuit metallic conductors 74 are located on the external surfaces of layers 66 and 70. Conductors 74 on opposite sides of the printed circuit board are interconnected with plated-through via holes (not shown). Conductors 74 correspond with the spring contacts 32 of the lead frame.

Figure 2:
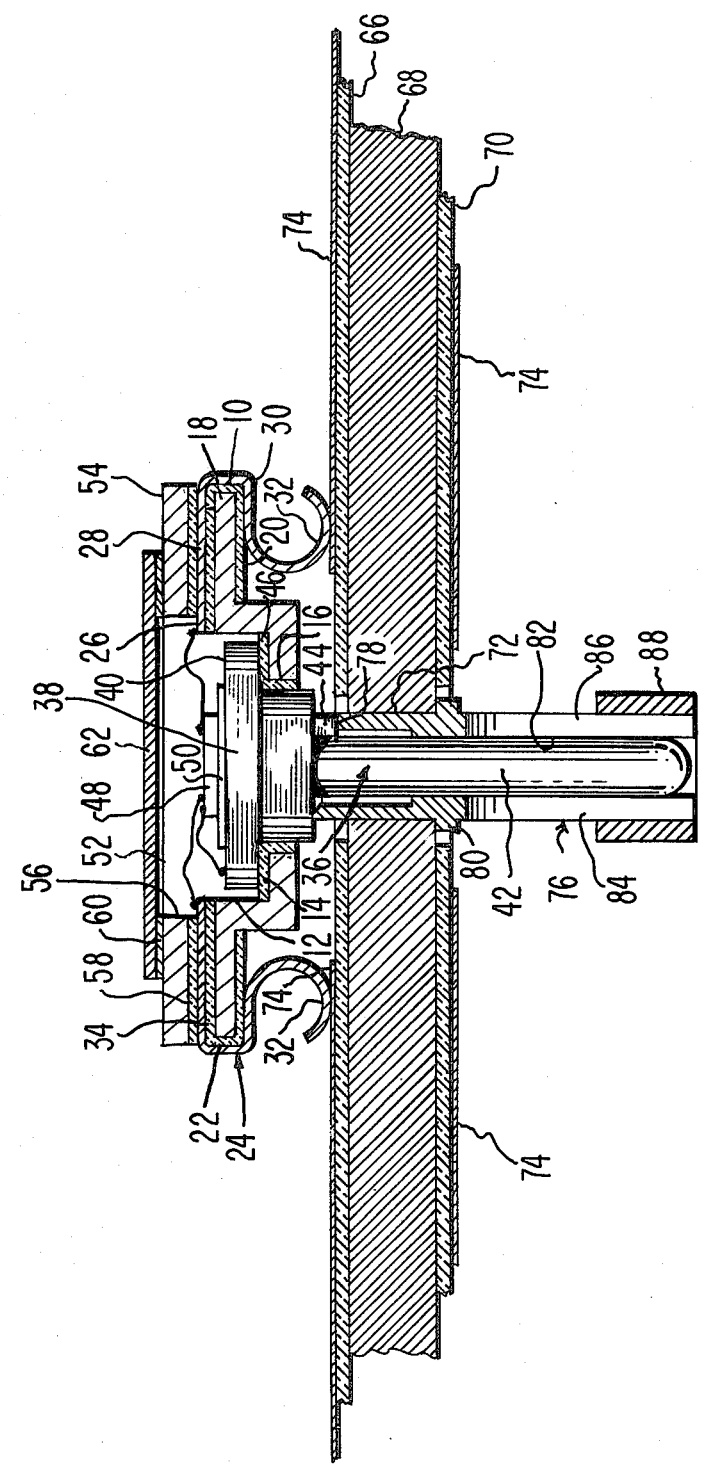
FIG. 2 shows a sectional view of the assembled package along the lines 2—2 of FIG. 1.

A receptacle 76 is preferably provided to receive rod portion 42 of stud 36. Receptacle 76 is generally of an annular shape and is formed of a heat conductive spring metal, such as beryllium-copper alloy CA 172. The upper surface of the receptacle 76 is countersunk and includes an indentation 78 in its periphery which corresponds with key 44 of stud 36. A radially extending projection 80 around the receptacle 76 provides an abutment for engaging the printed circuit board as shown most clearly in FIG. 2. Receptacle 76 includes a bore 82 extending longitudinally about its major axis. The bore 82 is slightly larger than the diameter of rod portion 42 of stud 36. In this example, it is nominally 0.065 inches in diameter, with rod portion 42 being nominally 0.062 inches in diameter. In such manner, rod portion 42 can be slidably mounted within receptacle 76. The lower portion of receptacle 76 includes two slits running longitudinally approximately half way up the length of the receptacle. Two tangs 84 and 86 are formed integral with receptacle 76 so as to exert a constant outward spring bias force against the ferrule 88. Each tang is mutually connected by the upper portion of the receptacle. The receptacle 76 is permanently soldered or press fit into opening 72 in circuit board 64 as shown in FIG. 2 with the side walls of the receptacle contacting the metallic middle layer 68. The package can be readily mounted onto the printed circuit board 64 merely by inserting rod portion 42 into the receptacle 76. The key 44 is received by indentation 78 to automatically align the spring contacts 32 of the package with their corresponding conductors 74 on the printed circuit board.

A ferrule 88 of thermally deformable metal surrounds the lower portion of receptacle 76. Thermally deformable metals are those metals capable of contracting and expanding when subjected to a temperature change. These materials exhibit two different crystallographic orientations, one in its martensite or low temperature phase, and the other in its austenite or high temperature phase. The change in crystallographic orientation results in a substantial amount of physical deformation between its two states. This deformation is fully recoverable and can be repeated indefinitely. A more detailed description of this material may be had by reference to U.S. Pat. No. 3,174,851 Beuhler et al. One such metal having thermally deformable characteristics is a nickel-titanium alloy distributed under the trade name Cryocon by Raychem Corporation. One embodiment of this material expands when it is cooled to below −30°C, a temperature below which the circuit board assembly will not be subjected in normal use. By cooling the ferrule 88 with an aerosol spray can of Freon, it will expand to such a degree that rod portion 42 of stud 36 can be easily inserted into the receptacle 76. When the ferrule temperature returns to about −30°C or above, it will contract and clamp the tangs 84 and 86 against the package stud 42 with substantial force. In such manner, the package is securely held in place by the force supplied by the ferrule 88 over the range of temperatures to which the circuit board foreseeably will be subjected. In order to remove the package one only need spray the ferrule with a cooling media such as Freon to expand it. Then the package can be easily lifted out of the receptacle 76.

The assembly shown in FIG. 2 provides many advantages over the prior art semiconductor packaging techniques. The unique lead frame configuration provides a continuous interfaceless path between the semiconductor device 48 and the printed circuit board conductors 74. Accordingly, the possibility of faulty interconnections are substantially reduced. If desired, each of the spring contacts 32 can include a barb to pierce non-noble metal plated circuit board conductors in order to accomplish electrical connection per U.S. Pat. No. 3,853,382, Lazar et al. Preferably, however, each of the contacts 32 would include a suitably coined and finished noble metal surface to contact the printed circuit board conductors without piercing them. The package design provides easy connectability with the printed circuit board without the necessity of an expensive intermediate connector. Furthermore, no soldering is required. Therefore, the time, expense and risks of the soldering operation is eliminated. The package can be readily removed merely through the use of a cooling medium to expand ferrule 88 as hereinbefore described. The unique assembly as just described provides excellent heat dissipation for the semiconductor device 48. The heat generated in device 48 is conducted through stud 36 through receptacle 76 and into the metallic middle layer 68 of the printed circuit board. The rod portion 42 extending underneath the printed circuit board also aids in heat dissipation. Another advantage of the metal core circuit board is that the metallic middle layer 68 can be used as an electrically conductive plane. For example, the device 48 can be connected to stud 36 with one or more filamentary wires 52 in order to connect it with the metallic middle layer 68 through receptacle 76. The metallic middle layer 68 can readily be connected to ground. This is convenient where a plurality of packages are attached to one printed circuit board. In such manner, the metallic middle layer 68 prvides a common low-inductance ground plane for all of the devices.

The unique lead frame structure of the present invention can be used in a package which does not utilize stud 36 to mount it on a printed circuit board. FIGS. 3 and 4 show such an embodiment. Substrate 90 includes a pedestal 92 adapted to receive semiconductor device 94. An epoxy preform 96 can be used to mount the chip 94 onto pedestal 92. Lead frame 100 is bonded to substrate 90 through the use of glass layers 98 on the substrate surfaces. A cover 102 encapsulates the completed package via a glass layer 102 after portions of the chip 94 have been bonded to inner portions of the lead frame 100, for example, as by filamentary wire interconnections 106. The package shown in FIGS. 3 and 4 can be mounted onto the printed circuit board with the use of a clamping system which presses down on the top of cover 102 to urge the spring contact portions of the lead frame 100 against the corresponding conductors on the printed circuit board. One such clamping system is disclosed in U.S. Pat. No. 3,942,854, entitled "Hold Down Device For Use In Systems Employing Integrated Circuits," filed Oct. 9, 1974, by Klein et al and having the same assignee as the present invention. However, the unique lead frame structure of the present invention eliminates the need for the intermediate connector disclosed in that patent.

While a metallic substrate is preferred because of its excellent thermal conductivity and because of the thermal expansion coefficient matching with the lead frame material, a ceramic substrate can also be used if desired. Similarly, a variety of covers can be employed to meet the manufacturers needs and processing specifications. Therefore, while this invention has been described in connection with one specific example thereof, no limitation is intended thereby except as defined in the appended claims.

I claim:

1. A semiconductor chip package subassembly comprising:
    a substrate having a first major surface, side portions, and a second surface opposite the first surface, said substrate having means thereon for supporting a semiconductor chip; and
    a conductive lead frame having a plurality of mutually spaced finger members, each finger member having integral inner, intermediate, and outer portions; at least the inner portions of the lead frame being bonded to the first surface of the substrate and converging on said supporting means, said intermediate portions being on said substrate first surface and extending from said inner portions to the side portions of the substrate, said outer portions extending around said substrate side portions and forming spring contacts projecting from the second surface of the substrate, whereby the lead frame finger members provide a continuous interfaceless electrically conductive path for connecting a semiconductor chip directly to conductors on a printed circuit board without the need of an intermediate connector or soldering.

2. The subassembly of claim 1 wherein the lead frame is a metal having a yield strength of at least 80,000 psi.

3. The subassembly of claim 1 wherein the substrate is metallic and the lead frame is bonded to the substrate with a layer of glass.

4. The subassembly of claim 3 wherein the substrate and the lead frame are made of a copper alloy containing aluminum which forms an oxide film that facilitates bonding to said glass layer.

5. The subassembly of claim 1 wherein said supporting means comprises a recess in the substrate first surface, said recess having an opening extending to said second surface, and a metallic heat sink member mounted in the recess for attaching a semiconductor device thereto.

6. The subassembly of claim 1 which further comprises means for encapsulating a semiconductor device after it has been attached to the supporting means on the substrate.

7. The subassembly of claim 5 wherein the heat sink member is in the form of a stud with body portions extending from said second substrate surface through said opening.

8. The subassembly of claim 7 which further comprises means cooperating with said stud body portion for securing it in an aperture in a printed circuit board to thereby engage said spring contacts of the lead frame finger members with corresponding conductors on the circuit board.

9. A package for a semiconductor chip which is readily connectable with a printed circuit board without requiring intermediate connectors or soldering, said package comprising:
    a substrate having an upper major surface, side portions, and a lower surface, said substrate having an opening therein extending orthogonally to the major surface;
    a thermally conductive stud mounted in the substrate opening, said stud having an upper end face for receiving a semiconductor chip and lower body portions extending from the substrate lower surface;
    a conductive lead frame having a plurality of mutually spaced finger members, each finger member having integral inner, intermediate, and outer portions; at least the inner portions of the lead frame being bonded to said substrate upper surface and converging on said opening, said intermediate portions being on said substrate upper surface and extending from said inner portions to the side portions of the substrate, said outer portions extending around said substrate side portions and forming spring contacts projecting from the lower surface of the substrate; and
    a rigid cover member on the substrate upper surface and sandwiching the intermediate portions of the lead frame therebetween for encapsulating a semiconductor chip bonded to said stud end face;
    wherein the lead frame of the package provides a continuous interfaceless electrically conductive path for connecting the chip directly to conductors on the printed circuit board without the need of an intermediate connector or soldering.

10. The package of claim 9 which further comprises means cooperating with said stud body portions for securing it in an aperture in a printed circuit board to thereby engage said spring contacts of the lead frame finger members with corresponding conductors on a printed circuit board.

11. The package of claim 7 wherein the substrate is metallic, and the lead frame is bonded to the substrate with a layer of glass.

12. The package of claim 5 wherein the substrate and the lead frame are made of a copper alloy containing aluminum which forms an oxide film that facilitates bonding to said glass layer.

* * * * *